(12) United States Patent
Barkatullah et al.

(10) Patent No.: US 6,629,255 B1
(45) Date of Patent: Sep. 30, 2003

(54) GENERATING A 2-PHASE CLOCK USING A NON-50% DIVIDER CIRCUIT

(75) Inventors: Javed S. Barkatullah, Portland, OR (US); Thomas D. Fletcher, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/576,943

(22) Filed: May 22, 2000

(51) Int. Cl.$^7$ .............................. G06F 1/04; G06F 1/06
(52) U.S. Cl. ................. 713/500; 713/401; 713/503; 327/100
(58) Field of Search ................. 713/401, 500, 713/503; 327/100

(56) References Cited

U.S. PATENT DOCUMENTS

| | | | | |
|---|---|---|---|---|
| 5,734,469 | * | 3/1998 | Strandjord | 359/459 |
| 5,867,043 | * | 2/1999 | Kim | 327/257 |
| 5,945,857 | * | 8/1999 | Havens | 327/175 |
| 6,292,042 | * | 9/2001 | Kim et al. | 327/257 |
| 6,339,354 | * | 1/2002 | Heightley | 327/278 |

\* cited by examiner

*Primary Examiner*—Thomas Lee
*Assistant Examiner*—Michael Nieves
(74) *Attorney, Agent, or Firm*—Blakely, Sokoloff, Taylor & Zafman LLP

(57) ABSTRACT

A logic circuit is disclosed having a digital divider that is capable of generating an intermediate signal in response to an input digital clock signal having a 50% duty cycle, where the intermediate signal has a non-50% duty cycle. First and second output signals are generated by a digital delay circuit in response to the intermediate signal. In the digital delay circuit, the first output signal is delayed by an odd number of substantially identical inverter delays, while the second output signal is delayed by an even number of inverter delays. Such a circuit helps reduce and perhaps minimize the sensitivity of the relative phase difference between the output signals to variations in temperature, supply voltage, and fabrication process parameters. When generated locally, this 2-phase clock does not require the distribution of two clock signals throughout the integrated circuit die or printed wiring board, but rather just one, thereby simplifying both the layout of the circuit as well as the control of clock accuracy in the system.

15 Claims, 3 Drawing Sheets

Microfiche Appendix Included
(16 Microfiche, 1490 Pages)

GENERATING A 2-PHASE CLOCK USING A NON-50% DIVIDER CIRCUIT

FIELD OF THE INVENTION

This invention is generally related to digital clock circuits, and more particularly to techniques for generating a 2-phase clock.

BACKGROUND

Conventional clock circuits generate periodic digital signals, for instance those having a square wave with a 50% duty cycle, for timing purposes in various applications. Certain applications, such as microprocessor and computer bus timing, require a so-called "2-phase clock" that has two separate output signals. One of these signals asserts a pulse responsive to a rising edge of an input clock whereas the other asserts a pulse responsive to the falling edge of the input clock. These output signals are usually generated locally, i.e. physically near the logic functional units which are clocked by them, using latches and flip-flops that are fed by a single input clock which is distributed over the integrated circuit (IC) die or printed wiring board (PWB). In most cases, these latches and/or flip flops are required to have the same time delay in generating their respective pulses. Such a requirement may be defined as D1=D2 as shown in the timing diagram of FIG. 1.

A technique to generate the 2-phase clock shown in FIG. 1 is depicted in FIG. 2. A divider circuit 204 divides a double frequency clock derived from a phase locked loop (PLL) by two, resulting in a 50% duty cycle input clock. The output of the divider circuit 204 is distributed and fed to a local digital delay circuit 208 having two paths. One path has an even number of inverter elements whereas the other has an odd number, to yield the 180° out of phase, 2-phase clock in S1 and S2. To keep D1=D2, the total delay in the S1 path of the delay circuit 208 must equal that in the S2 path. Thus, for the five inverter element design of FIG. 2, each inverter element in the S1 path presents a delay essentially equal to (D1/2) whereas each element in the S2 path has a delay of (D1/3). The inverter elements in each path are replicate logic inverter circuits which are designed to exhibit the particular delay shown, based upon the fixed delay D1=D2.

An important problem with the circuit design of FIG. 2 is that in the manufactured version of the circuit, D1 and D2 will not precisely track each other with fabrication process, supply voltage, and temperature variations. This is in part because an inverter element in the S1 path is designed to exhibit a different delay than one in the S2 path, and hence these elements do not show the same change in delay as a function of process, supply, and temperature variations. As a result, D1 may no longer be equal to D2 when there are substantial variations in fabrication process parameters, supply voltage, and temperature. This difference can prove to be fatal to microprocessor and bus timing in high speed digital systems which require an essentially identical, very accurate and stable 2-phase clock to be available in different areas of the IC die or PWB, across a wide range of variations.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

According to an embodiment of the invention, an article of manufacture such as an integrated circuit (IC) die or printed wiring board assembly is described that features an improved circuit design for generating a 2-phase clock. The circuit design allows the use of essentially identical inverter elements in a divider circuit and in a delay circuit which generate the two output signals, thereby allowing the phase difference between the two output signals to remain relatively fixed as a function of variations in fabrication process parameters, supply voltage, and temperature.

Figure 3:
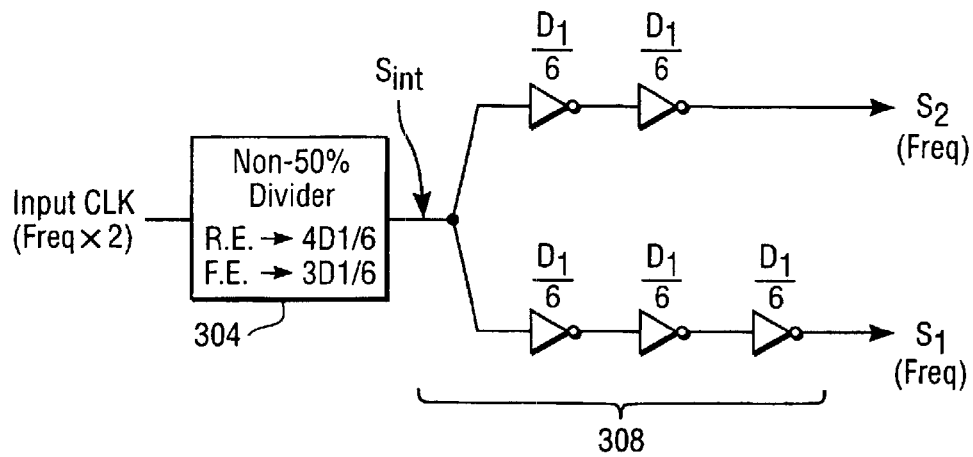
FIG. 3 depicts a block diagram of a digital circuit for generating a 2-phase clock according to an embodiment of the invention.

FIG. 3 illustrates a block diagram of an embodiment of the circuit for generating the 2-phase clock. The circuit includes a digital divider circuit 304 whose input receives the input clock at a given frequency (freqx2) and generates an intermediate signal Sint. The intermediate signal Sint is fed to a digital delay circuit 308 that has two paths for generating first and second output signals, S1 and S2, respectively.

The divider circuit 304 is a "non-50%" divider in the sense that it is capable of generating a non-50% duty cycle intermediate signal in response to an input clock that has a 50% duty cycle. In other words, the frequency of Sint is lower than that of the input clock, e.g. a fraction of the input clock, and its duty cycle is not 50% when the duty cycle of the input clock is 50%. The significance of the non-50% duty cycle will become apparent in connection with FIG. 4 described below.

In the digital delay circuit 308, one path delays the first output signal S1 by an odd number of essentially identical inverter delays whereas the second output signal S2 is delayed by an even number of the same inverter delays. Thus, substantially identical inverters are used in the delay circuit 308. The use of substantially identical inverters allows the phase difference between the two output signals to remain essentially fixed despite variations in temperature, supply voltage, and fabrication process parameters provided that substantially identical inverters are also used in the divider circuit 304.

Although not specifically shown in FIG. 3, the IC die or the printed wiring board may further include a clock generator circuit (not shown) used to generate the input digital clock signal. In some applications, the clock generator circuit derives its output from a crystal controlled oscillator that provides a very stable and repeatable source of oscillations. This input digital clock signal will exhibit a highly stable and accurate phase relationship between consecutive rising edges and may be derived using any suitable digital frequency control circuit including a phase locked loop or a delay locked loop. The input digital clock signal may be extracted from, for instance, a bus or other communication channel using a clock or data recovery circuit. In general, a wide range of means for generating the input digital clock signal are contemplated that result in a relatively stable and accurate digital signal whose consecutive rising edges have a pre-determined and preferably fixed phase relationship.

The particular example shown in FIG. 3 results in the first and second output signals having a frequency of exactly one-half that of the fundamental frequency of the input clock signal. However, the invention need not be limited to a divide by 2 circuit, but rather may also work with divide by 4, divide by 6 . . . depending on the particular application. Operation of the divide by 2 example may be described using the timing diagram of FIG. 4.

Figure 1:
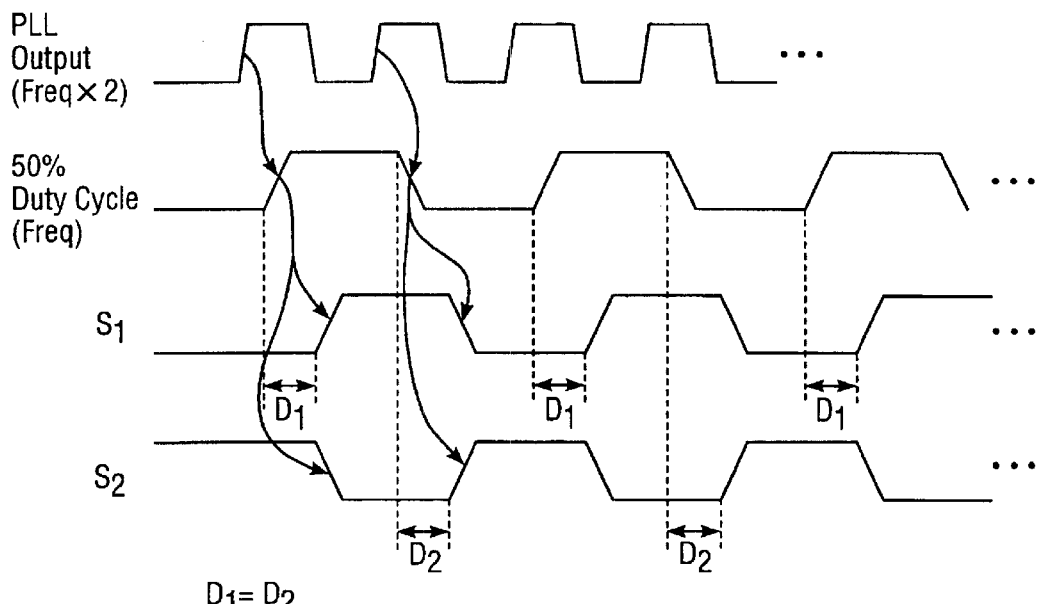
FIG. 1 illustrates a timing diagram of the generation of a 2-phase clock.
Figure 2:
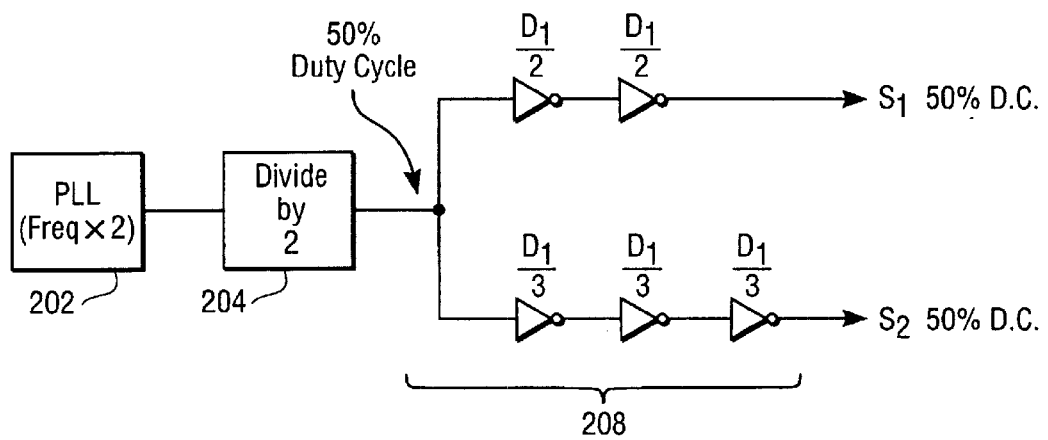
FIG. 2 shows a circuit diagram of a delay circuit that may be used to generate the 2-phase clock based on an input 50% duty cycle clock.
Figure 4:
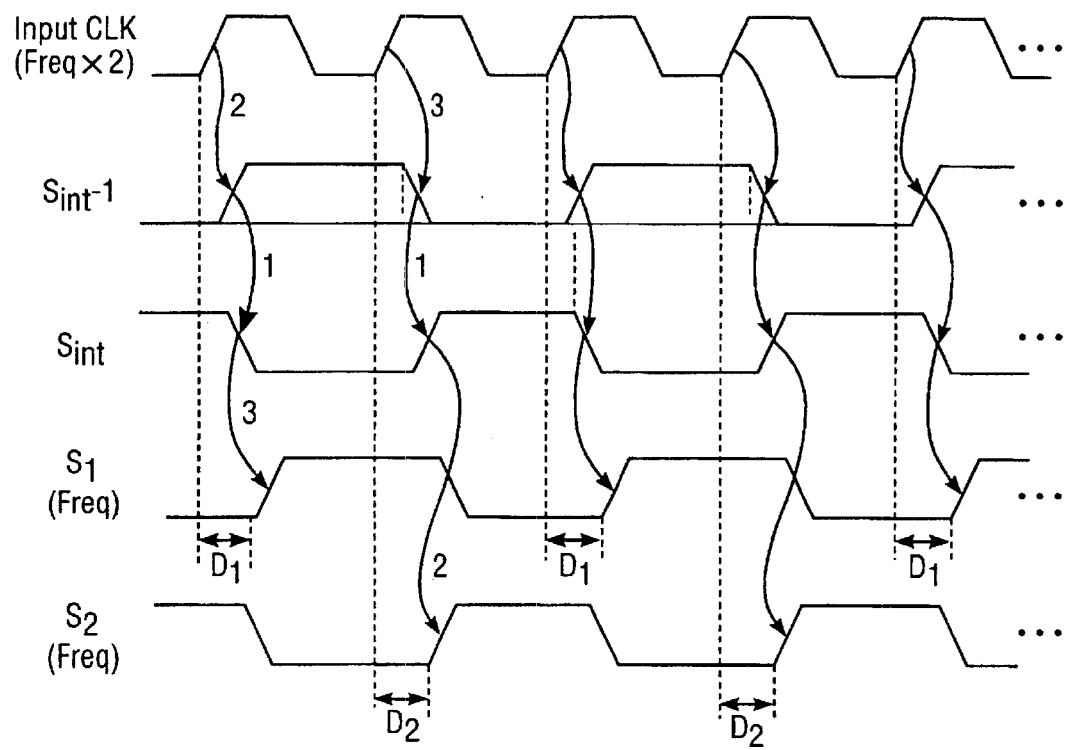
FIG. 4 shows a timing diagram for generating a 2-phase clock according to an embodiment of the invention.

There are four signals illustrated in the timing diagram of FIG. 4. These are the input clock, the intermediate signal Sint, the intermediate signal minus one inverter delay (Sint−1), and the two output signals S1 and S2. The desired characteristic in the output signals is that D1, the total delay between a rising edge of S1 and a first rising edge of the input clock, be the same as D2 which is the delay between a rising edge of the second output signal S2 in relation to a second rising edge of the input clock. Note that the input clock in FIG. 4 has twice the frequency of the input clock in the example of FIG. 1, so that the output signals S1 and S2 in FIG. 4 also have twice the frequency of the output signals in FIG. 1. A conventional divider (not shown) may be used to further reduce the frequency of S1 and S2 in FIG. 4, without affecting their phase relationship defined by D1=D2.

Continuing to refer to FIG. 4, it is shown that the intermediate signal Sint has a falling edge delayed by a first amount in relation to a first rising edge of the input clock, and a rising edge delayed by a second amount in relation to a second rising edge of the input clock. Note that these first and second amounts differ by an integer number of essentially identical inverter delays, where these inverter delays are the same as those to be used in the delay circuit 308 (see FIG. 3). For the particular timing example in FIG. 4, the falling edge of Sint is delayed by 2+1=3 inverter delays, whereas its rising edge is delayed by 3+1=4 inverter delays. The different delays for the rising and falling edges are also indicated in FIG. 3. This difference in delay between the rising and falling edges is responsible for the non-50% duty cycle in S1 and S2.

To obtain the desired characteristic of D1=D2, the example of FIG. 3 has exactly six identical inverter delays in the path of the first output signal S1 and in the path of the second output signal S2. To ensure precise control of D1=D2, the inverter delays in the divider circuit 304 should be identical to those in the delay circuit 308. Referring to FIG. 4, it can be seen that the divider circuit and the delay circuit should be configured so that a rising edge of S1 is delayed in relation to a first rising edge of the input clock by the same number (here, six) of inverter delays as a rising edge of S2 is delayed in relation to a second rising edge of the input clock. Such a fixed phase relationship between S1 and S2, a desirable effect, is maintained despite variations in process parameters, supply variations, and temperature, because only identical unit inverter delays are used in the signal path between the input clock and S1 and S2. For the examples shown in FIGS. 3 and 4, this unit inverter delay is D1/6, but more generally may be any fraction 1/N, where N is an integer, of the desired delay D1. Also, although the particular example described above shows that the number of inverter delays presented by the delay circuit 308 to generate S1, differs by only one from those used to generate S2, the circuit may be designed to work more generally with any odd number of inverter delays in the S1 path and any even number of inverter delays in the S2 path.

Although in the timing diagram of FIG. 4, the input clock that is applied to the divider circuit 304 has a 50% duty cycle, the invention's techniques for generating the 2-phase clock need not be limited to a 50% duty cycle input clock.

The desirable effect in the delays of the output signals, D1=D2, may be obtained with input clocks that do not have 50% duty cycles, because, as seen in FIG. 4, D1 and D2 are aligned with respect to each rising edge of the input clock, rather than both the rising edge and the falling edge of the input clock. This is in contrast to the timing diagram of FIG. 1 in which both the rising and falling edges of the input clock were used to generate the output signals. The use of the 50% duty cycle input clock merely illustrates the capabilities of the divider circuit 304, because when the input to such a divider circuit is a 50% duty cycle clock, its output is non-50% because the rising and falling edges in Sint are delayed by different amounts.

Figure 5:
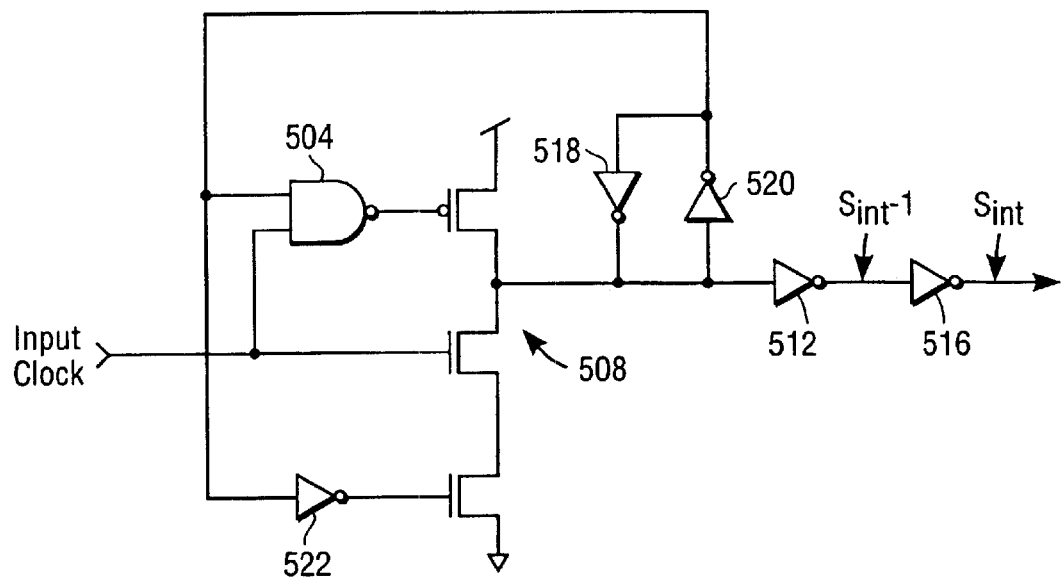
FIG. 5 is a circuit schematic of a particular embodiment of the divider circuit.

FIG. 5 shows a circuit schematic of a metal oxide semiconductor (MOS) implementation of the divider circuit 304. The input clock is shown as being fed to a first NAND gate 504 and an upper n-channel device of an inverter 508. The output of the inverter 508 is fed to another inverter 512 which in turn feeds the input of another inverter 516, where the intermediate signal Sint and its leading version Sint−1 are also shown. A feedback network of inverters 518, 520, and 522 helps provide the differentiation between the rising and falling edges of the input clock. Operation of the circuit may be described using the following example, also referring to the timing diagram of FIG. 4. Assume that the output of the inverter 508 is at a logic high level which results in Sint also being at a logic high level. This also results in the p-channel transistor of the inverter 508 to be in cutoff, while the lower n-channel of the same inverter 508 may conduct. A first rising edge of the input clock causes the upper n-channel transistor in the inverter 508 to conduct, such that the output of the inverter 508 is pulled to a logic low level. Note that the output of the NAND gate 504 will not change in response to a low to high transition of the input clock. Thus, the low to high transition of the input clock results in Sint transitioning from high to low following three inverter delays presented by inverters 508, 512, and 516.

After Sint has transitioned, the feedback from the output of inverter 508 causes the output of NAND gate 504 to change to a logic low level (because both inputs are now at a logic high level). This action allows the p-channel of inverter 508 to fully conduct, while at the same time cutting off the lower n-channel of the same inverter.

Note that a high to low transition in the input clock will not affect Sint, because the lower n-channel device of inverter 508 continues to conduct and maintains the output of the inverter 508 at a logic low level. When the second rising edge of the input clock arrives, the transition in Sint (this time from high to low) follows a slightly longer path, namely one through the NAND gate 504, and inverters 508, 512, and 516. The circuit thus switches back and forth, alternately exhibiting three and four inverter delays to the low to high transition in the input clock. There are a wide range of alternative circuits which one of ordinary skill in the art may devise to exhibit alternating odd and even number of inverter delays to the rising edges of the input clock. To maintain the precision in holding D1=D2 (see FIG. 3 and FIG. 4) the inverters used in FIG. 5 for the divider circuit 304 should be essentially identical to those used in the delay circuit 308 in FIG. 3.

Figure 6:
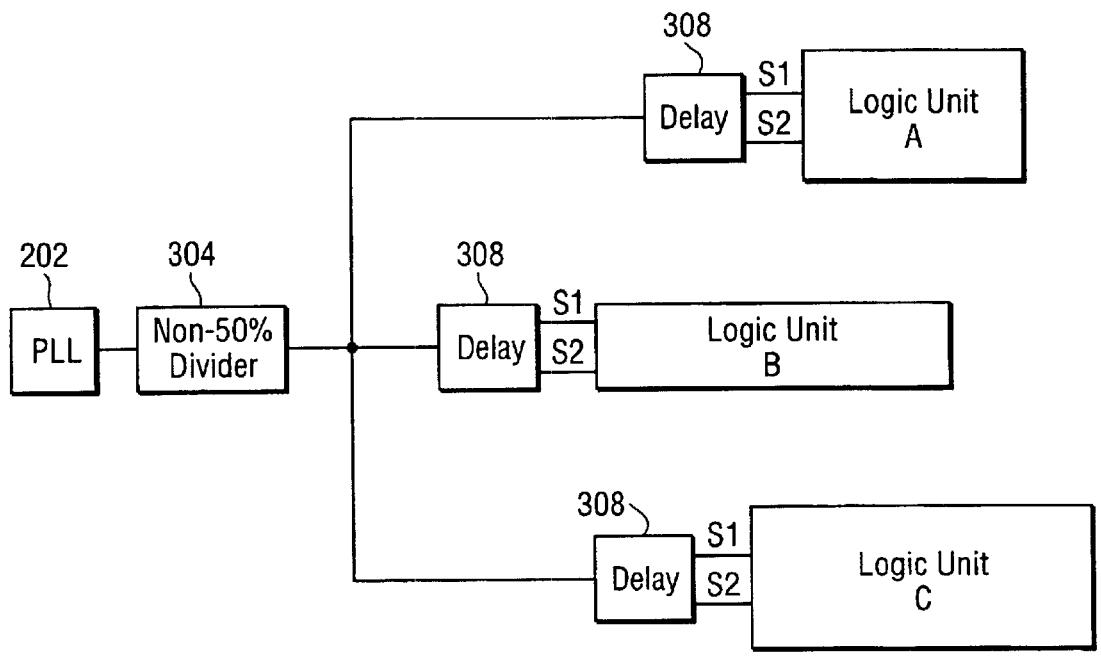
FIG. 6 illustrates a block diagram of an application of the 2-phase clock generation circuitry.

As mentioned above, the 2-phase clock has timing applications in complex logic systems, either IC dies or PWBs. These are generally illustrated in FIG. 6. A number of logic units A, B, and C are shown, where each has its separate delay circuit 308 receiving a copy of the intermediate signal Sint provided by the non-50% divider circuit 304. Each logic unit may be part of a separate IC die on a PWB, or it may be a functional unit of a single or multiple die packaged logic system such as an advanced processor. As an alternative to distributing Sint, the output of the PLL may be distributed to a separate non-50% divider circuit at each logic unit.

To summarize, various embodiments of the invention have been described that are directed to an improved technique for generating a 2 phase clock using a non-50% divider circuit. In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An article of manufacture comprising:
   a digital divider circuit capable of generating an intermediate signal in response to an input digital clock signal having a 50% duty cycle, the intermediate signal having a non-50% duty cycle; and
   a digital delay circuit capable of generating first and second output signals in response to the intermediate signal, the first output signal to be delayed by an odd number of essentially identical inverter delays, and the second output signal to be delayed by an even number of the inverter delays.

2. The article of manufacture of claim 1 further comprising a clock generator circuit to generate the input digital clock signal.

3. The article of manufacture of claim 2 wherein the divider circuit is capable of causing the intermediate signal to have a fundamental frequency equal to one half that of the input signal.

4. The article of manufacture of claim 1 wherein the divider circuit is capable of generating the intermediate signal having a falling edge delayed by a first amount in relation to a first rising edge of the input signal and a rising edge delayed by a second amount in relation to a second rising edge of the input signal, the first and second amounts differ by an integer number of essentially identical inverter delays.

5. The article of manufacture of claim 4 wherein the delay circuit is further configured to generate the first output signal having a rising edge delayed by an odd number of the inverter delays in relation to the falling edge of the intermediate signal, the second output signal having a rising edge delayed by an even number of the inverter delays in relation to the rising edge of the intermediate signal.

6. The article of manufacture of claim 1 wherein the divider circuit and the delay circuit are capable of delaying a rising edge of the first output signal in relation to a first rising edge of the input signal by the same number of the inverter delays as a rising edge of the second output signal is delayed in relation to a second rising edge of the input signal.

7. The article of manufacture of claim 1 wherein the number of inverter delays presented by the delay circuit to generate the first output signal differs by only one from those used to generate the second output signal.

8. A method comprising:
   generating an intermediate signal in response to an input digital clock signal, the intermediate signal having a falling edge delayed by a first amount in relation to a first rising edge of the input signal and a rising edge delayed by a second amount in relation to a second rising edge of the input signal, the first and second amounts differ by an integer number of essentially identical inverter delays; and
   generating first and second output signals in response to the intermediate signal, the first output signal having a rising edge delayed by an odd number of the inverter delays in relation to the falling edge of the intermediate signal, the second output signal having a rising edge delayed by an even number of the inverter delays in relation to the rising edge of the intermediate signal.

9. The method of claim 8 further comprising generating the input digital clock signal.

10. The method of claim 9 wherein the intermediate signal has a fundamental frequency equal to one half that of the input signal.

11. The method of claim 9 wherein the input digital clock signal has a 50% duty cycle.

12. An article of manufacture comprising:
   means for generating an intermediate signal in response to an input digital clock signal, the intermediate signal having a falling edge delayed by a first amount in relation to a first rising edge of the input signal and a rising edge delayed by a second amount in relation to a second rising edge of the input signal, the first and second amounts differ by an integer number of essentially identical inverter delays; and
   means for generating first and second output signals in response to the intermediate signal, the first output signal having a rising edge delayed by an odd number of the inverter delays in relation to the falling edge of the intermediate signal, the second output signal having a rising edge delayed by an even number of the inverter delays in relation to the rising edge of the intermediate signal.

13. The article of manufacture of claim 12 further comprising means for generating the input digital clock signal.

14. The article of manufacture of claim 13 wherein said intermediate signal generation means is further configured to cause the intermediate signal to have a fundamental frequency equal to one half that of the input signal.

15. The article of manufacture of claim 13 wherein the input signal generation means is further configured to cause the input digital clock signal to have a 50% duty cycle.

* * * * *